US012330934B2

(12) United States Patent
Vercesi et al.

(10) Patent No.: US 12,330,934 B2
(45) Date of Patent: Jun. 17, 2025

(54) EMBEDDED PERMEABLE POLYSILICON LAYER IN MEMS DEVICE FOR MULTIPLE CAVITY PRESSURE CONTROL

(71) Applicant: STMicroelectronics International N.V., Geneva (CH)

(72) Inventors: Federico Vercesi, Milan (IT); Andrea Nomellini, Milan (IT); Paolo Ferrari, Va (IT)

(73) Assignee: STMicroelectronics International N.V., Geneva (CH)

( * ) Notice: Subject to any disclaimer, the term of this patent is extended or adjusted under 35 U.S.C. 154(b) by 372 days.

(21) Appl. No.: 18/084,811

(22) Filed: Dec. 20, 2022

(65) Prior Publication Data

US 2024/0199415 A1  Jun. 20, 2024

(51) Int. Cl.
*B81C 1/00* (2006.01)
*B81B 7/00* (2006.01)

(52) U.S. Cl.
CPC ........ *B81C 1/00285* (2013.01); *B81B 7/0038* (2013.01); *B81B 2201/0235* (2013.01); *B81B 2201/0242* (2013.01); *B81B 2203/0315* (2013.01); *B81B 2207/07* (2013.01); *B81C 2201/0109* (2013.01); *B81C 2201/0132* (2013.01); *B81C 2201/0178* (2013.01); *B81C 2203/0118* (2013.01)

(58) Field of Classification Search
None
See application file for complete search history.

(56) References Cited

U.S. PATENT DOCUMENTS

| 2013/0283912 | A1* | 10/2013 | Lin ...................... G01L 13/025 73/717 |
| 2014/0264648 | A1* | 9/2014 | Chu .......................... B81B 7/04 257/415 |
| 2016/0244325 | A1* | 8/2016 | Cheng ................ B81C 1/00293 |

* cited by examiner

*Primary Examiner* — Benjamin P Sandvik
(74) *Attorney, Agent, or Firm* — Crowe & Dunlevy LLC

(57) ABSTRACT

Disclosed herein is a process flow for forming a MEMS IMU including an accelerometer and a gyroscope each located in a separate sealed cavity maintained at a different pressure. Formation of the MEMS IMU includes the use of a first vHF release to etch a sacrificial layer underneath a structural layer containing the accelerometer and gyroscope and capping the device under formation to set both cavities at a first pressure. The floor of one of the cavities is formed to including a gas permeable layer. Formation further includes forming a chimney underneath the gas permeable layer and then performing a second vHF release to etch through the gas permeable layer and expose the cavity containing the gas permeable layer so that its pressure may be set to be different than that of the other cavity when the chimney is sealed.

20 Claims, 16 Drawing Sheets

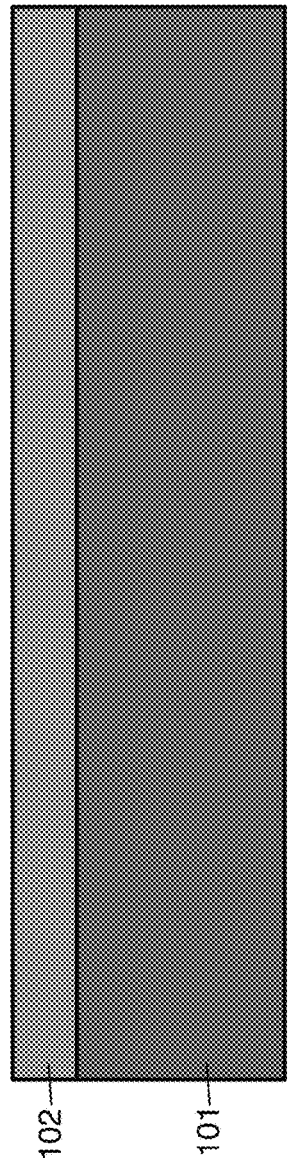
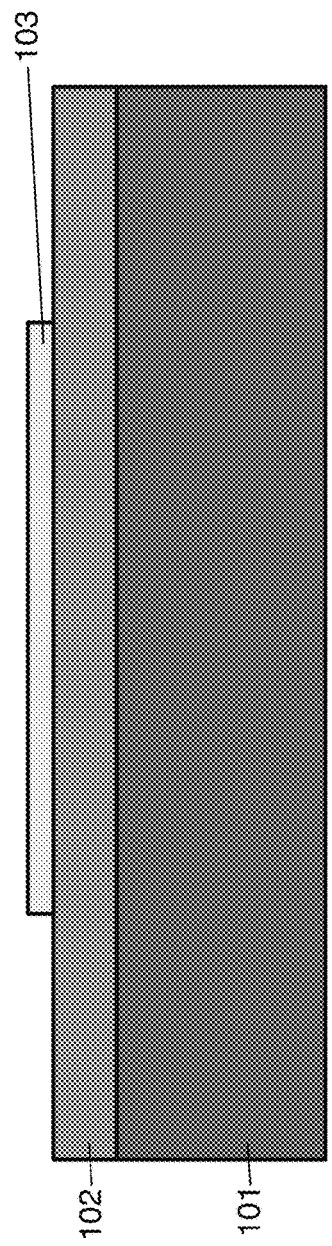
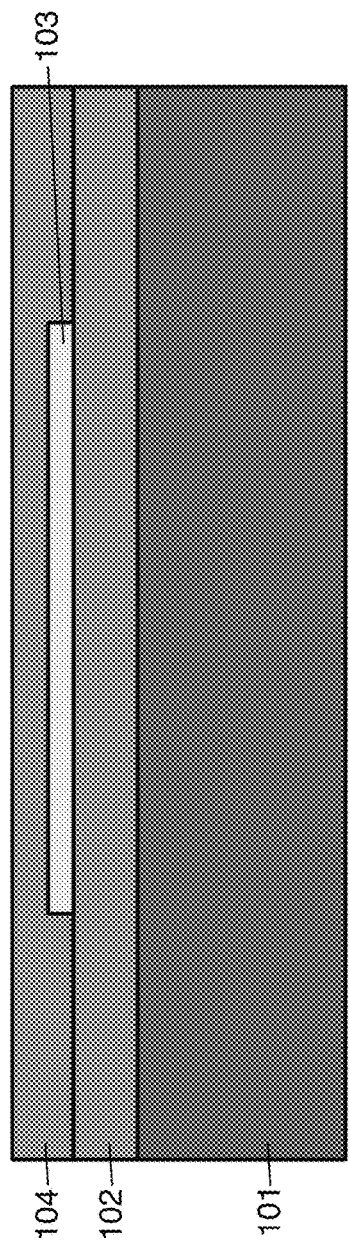

EMBEDDED PERMEABLE POLYSILICON LAYER IN MEMS DEVICE FOR MULTIPLE CAVITY PRESSURE CONTROL

TECHNICAL FIELD

This disclosure is directed to the field of microelectromechanical systems (MEMS) devices and, more particularly, to the use of an embedded permeably polysilicon layer in the fabrication of an inertial measuring unit (IMU) MEMS device to have multiple instrument containing cavities maintained at different pressures.

BACKGROUND

An inertial measurement unit (IMU) is an electronic device that includes both an accelerometer and a gyroscope and that combines their output together to provide correlated acceleration and angular velocity data of a body into which the IMU is incorporated. Microelectromechanical systems (MEMS) devices are microscale moving devices, formed of components between 1 µm and 100 µm in size, with the MEMS devices themselves generally ranging in size between 20 µm and 1 mm. As is known, an IMU can be formed using MEMS technology, and such a MEMS IMU contains at least one accelerometer and at least one gyroscope.

Ideal operating conditions for MEMS accelerometers are different from ideal operating conditions for MEMS gyroscopes—for example, ideal operating pressure for MEMS accelerometers may be approximately 100 mBar while ideal operating pressure for MEMS gyroscopes may be approximately 0.1 mBar to 10 mBar. To accommodate this, MEMS IMUs locate their accelerometers and gyroscopes in different cavities maintained at different pressures.

As can be appreciated, forming such MEMS IMUs with multiple cavities maintained at different pressures presents fabrication challenges. One known way to fabricate such devices is to form the device at the pressure of the accelerometer and to place a getter layer in the cavity containing the gyroscope. After fabrication, the getter layer is activated to reduce the pressure of the gyroscope cavity down to the desired operating pressure for the gyroscope. While this does produce a functioning MEMS IMU, the resulting design including the getter increases the complexity of the device and the overall pressure differential available between the cavities depends on the composition and concentration of gases in the atmosphere of the cavities as well as the specific getter layer used.

Another way to fabricate a MEMS IMU is described in U.S. Pat. No. 9,919,919 (the contents of which are incorporated by reference). Here, during fabrication, two sealed cavities are formed in a device body, with one cavity housing the accelerometer and the other cavity housing the gyroscope. An access opening is formed to connect one of the cavities to the environment, then the pressure within that cavity is adjusted, and thereafter heat is applied to seal the access opening. Therefore, during initial formation of the two sealed cavities, the fabrication is performed in the atmosphere and at the pressure desired for one of the cavities, and the access opening is subsequently used to adjust the atmosphere and pressure within the other cavity to match what is desired for that cavity. This technique also produces a functioning MEMS IMU having different cavities at different pressures, but the sealing of the access opening is time consuming and may be costly due to sealing every die individually.

As such, the known techniques for fabricating MEMS IMUs are insufficient for certain commercial desires. Therefore, further development is needed.

SUMMARY

Disclosed herein is a method of forming a package including a first instrument positioned within a first cavity maintained at a first pressure and a second instrument positioned within a second cavity maintained at a second pressure different than the first pressure. The method includes: forming an oxide layer on a substrate; depositing a permeable layer on the oxide layer, the permeable layer being gas permeable but vapor etch resistant; depositing an insulator layer on the permeable layer and exposed portions of the oxide layer; depositing a barrier layer on the insulator layer; depositing a sacrificial layer over exposed portions of the insulator layer; etching the sacrificial layer and insulator layer at portions thereof overlying the permeable layer so as to expose portions of the permeable layer; forming a structural layer over the sacrificial layer and exposed portions of the permeable layer; forming the first and second instruments in the structural layer; performing a first vapor etching through open portions of the structural layer to remove exposed portions of the sacrificial layer, the first vapor etching also passing through the permeable layer at the exposed portions thereof to thereby remove portions of the oxide layer underlying the permeable layer to expose portions of the substrate; and bonding a cap wafer to the structural layer at bonding points.

The bonding of the cap wafer to the structural layer serves to thereby: form the first cavity as being sealed by the cap wafer, portions of the barrier layer underlying the structural layer adjacent the first instrument, and the bonding points; and form the second cavity as being sealed by the cap wafer, portions of the barrier layer, underlying the structural layer adjacent the second instrument, and the exposed portions of the substrate. The bonding of the cap wafer to the structural layer is performed at a first pressure, thereby setting pressure within the first and second cavity to the first pressure.

The method continues with: forming a chimney opening extending through an entire thickness of the substrate to reach the permeable layer; performing a second vapor etching through the chimney opening and permeable layer to remove portions of the oxide layer under the permeable layer and portions of the insulator layer stacked on the permeable layer, thereby creating a fluid connection extending from the chimney into the second cavity; setting the pressure inside the second cavity to a second pressure different than the first pressure; and forming a plug in the chimney opening to thereby seal the second cavity.

The oxide layer may be a thermal oxidation layer. The permeable layer may be formed of a permeable polysilicon material. The insulator layer may be formed of silicon dioxide $SiO_2$.

The barrier layer may be formed of aluminum oxide or silicon nitride. The sacrificial layer may be formed of silicon dioxide $SiO_2$. The structural layer may be formed from polysilicon.

The first instrument may be an accelerometer and the second instrument may be a gyroscope, with the second pressure being less than the first pressure.

The bonding of the cap wafer to the structural layer may be performed by glass frit bonding, eutectic AlGe, or Au bonding.

Prior to depositing the sacrificial layer, the method may include: forming a runner layer on the barrier layer to create an interconnection layer; wherein the sacrificial layer is also deposited over the runner layer; wherein the runner layer is also etched along with the sacrificial layer and insulator layer to expose the portions of the permeable layer; wherein the structural layer is also formed over exposed portions of the runner layer; wherein the first cavity is also sealed by portions of the runner layer; wherein the second cavity is also sealed by portions of the runner layer; and wherein the second vapor etching is also performed to remove portions of the runner layer stacked on the permeable layer.

The method may further include exposing a portion of the interconnection layer.

Also disclosed herein is a method of forming a package including a first instrument positioned within a first cavity maintained at a first pressure and a second instrument positioned within a second cavity maintained at a second pressure different than the first pressure, the method including: performing a first vapor etching to etch a sacrificial layer underneath a structural layer containing the first and second instruments to thereby delimit a bottom of the first and second cavities; bonding a cap wafer over the first and second cavities to thereby delimit a top of the first second cavities, with a pressure during the bonding setting the first and second cavities to be at the first pressure; forming a chimney underneath a permeable layer disposed on a bottom of the second cavity; performing a second vapor etching through the chimney and the permeable layer to expose the second cavity; and forming a plug in the chimney to thereby re-seal second cavity, with a pressure during the formation of the plug setting the second cavity to be at the second pressure, the second pressure being less than the first pressure.

The permeable layer may be formed from a permeable polysilicon material.

The first instrument may be an accelerometer and the second instrument may be a gyroscope, with the second pressure being less than the first pressure.

The bonding of the cap wafer may be performed by bonding the cap wafer to a structural layer containing the first and second instruments. The bonding itself may be performed by glass frit bonding, eutectic AlGe, or Au bonding. The structural layer may be formed from polysilicon.

Device embodiments are also disclosed herein. In particular, also disclosed herein is a package including: a substrate having a through-hole defined in its back face; an oxide layer disposed on a front face of the substrate, with an opening defined in the oxide layer over the through-hole in the substrate; and a permeable layer disposed on the oxide layer and extending across the opening in the oxide layer.

An insulator layer is disposed at least on the oxide layer, with an opening defined in the insulator layer at least partially over the permeable layer, and a structural layer positioned over the insulator layer and permeable layer, with the structural layer having first and second instruments formed therein. A cap layer is bonded to the structural layer, wherein the insulator layer, structural layer, and cap layer are cooperative shaped so as to define a first sealed cavity containing the first instrument and a second sealed cavity containing the second instrument and the permeable layer. A first air pressure within the first sealed cavity is different than a second air pressure within the second sealed cavity.

A sealing plug may be positioned within the through-hole in the substrate, the sealing plug being shaped so as to environmentally seal the back face of the permeable layer against environmental instruction. The sealing plug may extend across and in contact with a back face of the permeable layer.

The first instrument may be an accelerometer and the second instrument may be a gyroscope, with the second air pressure being less than the first air pressure.

The permeable layer may be formed of a permeable polysilicon material. The oxide layer may be a thermal oxidation layer. The structural layer may be formed from polysilicon. The insulator layer may be formed from silicon dioxide SiO2.

BRIEF DESCRIPTION OF THE DRAWINGS

FIG. 1 is a cross sectional view of a MEMS IMU disclosed herein under formation at a first step in which a thermal oxidation layer is formed on a substrate.

FIG. 2 is a cross sectional view of the MEMS IMU disclosed herein under formation at a second step at which a permeable polycrystalline silicon (polysilicon) layer is formed on the thermal oxidation layer.

FIG. 3 is a cross sectional view of the MEMS IMU disclosed herein under formation at a third step at which the permeable polysilicon layer is buried with a silicon oxide layer.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Now described is a process flow for forming a MEMS IMU including an accelerometer and a gyroscope housed in separate sealed chambers having atmospheres that are at substantially different pressures. Initially, a thermal oxidation layer 102 (e.g., 1.8 μm to 3.2 μm in thickness) is formed on a substrate 101, as shown in FIG. 1. Thereafter, a permeable polycrystalline silicon (polysilicon) layer 103 (e.g., 0.06 μm to 0.16 μm in thickness) is deposited on the thermal oxidation layer 102 and patterned, as shown in FIG. 2. The permeable polysilicon layer 103 is a microporous material and is deposited for example using low pressure chemical vapor deposition (LPCVD). The porosity of the permeable polysilicon layer 103 allows for certain gases to pass through, for example those used in vapor-phase hydrofluoric acid (vHF) etching, while at the same time, the permeable polysilicon layer 103 is resistant to that etching itself and maintain structural integrity after afterward.

A silicon dioxide $SiO_2$ layer 104 (e.g., 0.02 μm to 2 μm in thickness) is then deposited over the exposed portions of the thermal oxidation layer 102 and the permeable polysilicon layer 103, for example by plasma-enhanced chemical vapor deposition (PECVD, using tetraethyl orthosilicate TEOS), as shown in FIG. 3, thereby burying the permeable polysilicon layer 103. Annealing is then performed (not shown).

Figure 4:
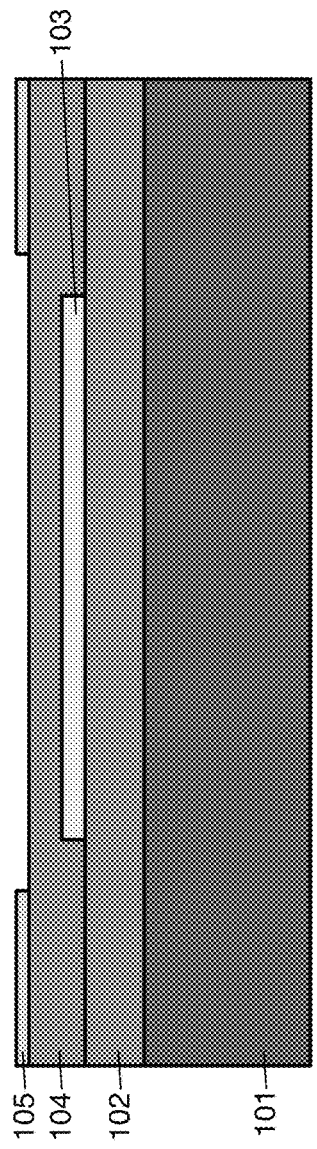
FIG. 4 is a cross sectional view of the MEMS IMU disclosed herein under formation at a fourth step at which an aluminum oxide or silicon nitride layer is deposited.

A HF etch resistant layer 105 is deposited over the SiO2 layer 104, as shown in FIG. 4. The HF etch resistant layer 105 may be formed from aluminum oxide or silicon nitride.

Figure 5:
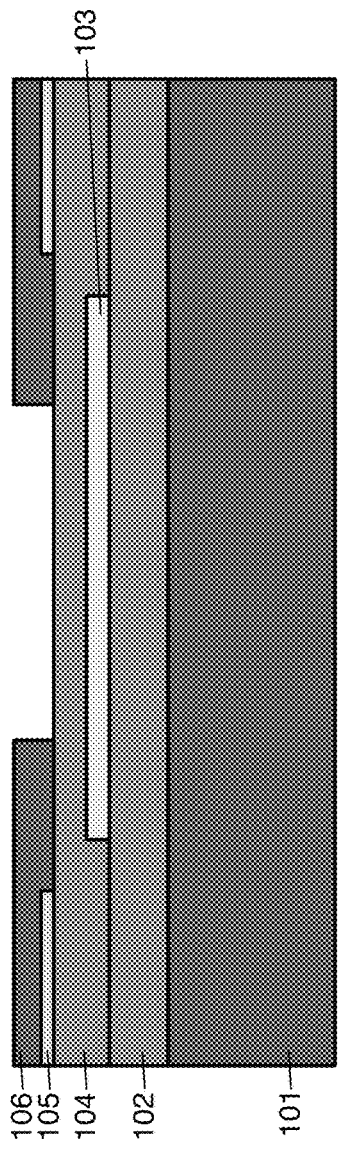
FIG. 5 is a cross sectional view of the MEMS IMU disclosed herein under formation at a fifth step at which a polysilicon layer is deposited.
Figure 6:
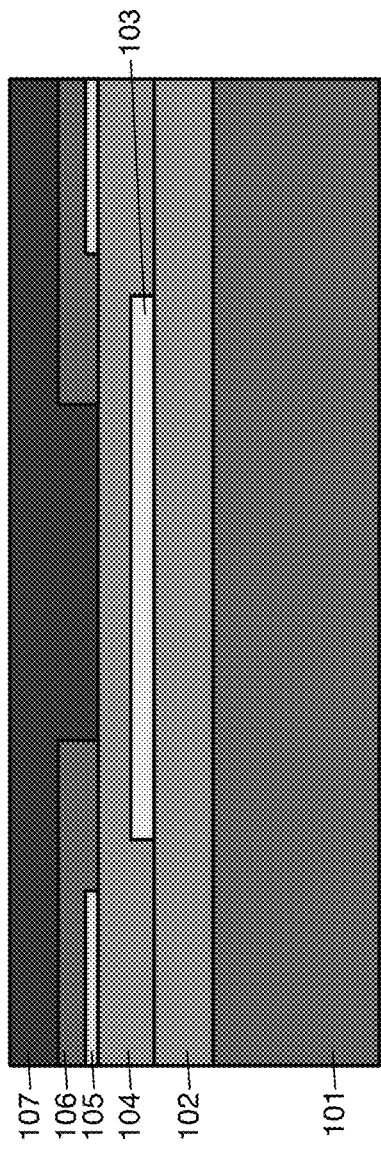
FIG. 6 is a cross sectional view of the MEMS IMU disclosed herein under formation at a sixth step at which a sacrificial silicon oxide layer is deposited.

A polysilicon layer 106 (e.g., 300-2000 nm in thickness) is then deposited and patterned, as shown in FIG. 5, for use as a runner in forming electrical interconnections. A sacrificial SiO2 layer 107 (e.g., 0.5 μm to 3.2 μm in thickness) is then deposited over the polysilicon layer 106 and exposed portions of the SiO2 layer 104 and planarized, as shown in FIG. 6.

Figure 7:
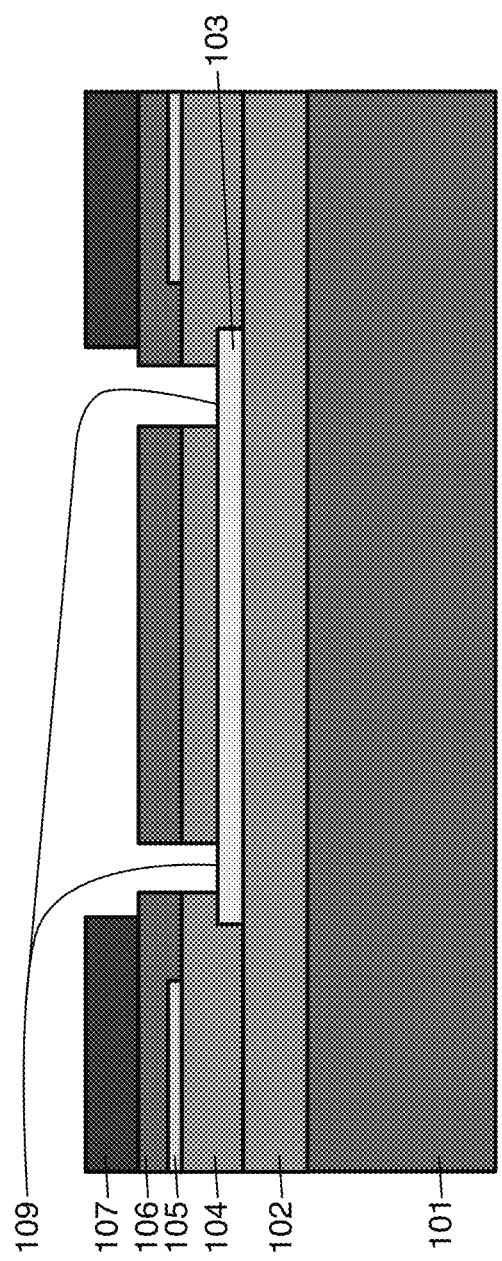
FIG. 7 is a cross sectional view of the MEMS IMU disclosed herein under formation at a seventh step after an etch.

Anchor masking and oxide etching is then performed, as shown in FIG. 7, yielding openings 109 exposing the permeable polysilicon layer 103, setting the overlap between SiO2 layer 104 and sacrificial SiO2 layer 107 as desired, for example between 2 μm and 20 μm.

Figure 8:
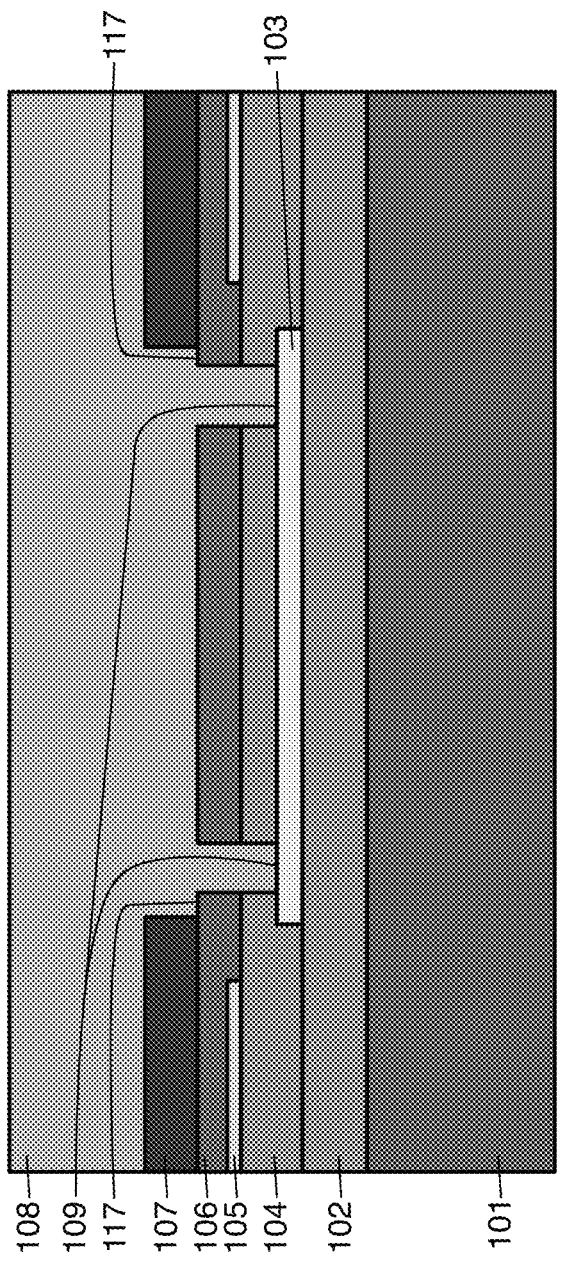
FIG. 8 is a cross sectional view of the MEMS IMU disclosed herein under formation at an eighth step after a functional layer of polysilicon is deposited.

A structural layer 108 (e.g., a polysilicon layer of 15 μm to 60 μm in thickness) is then grown over the sacrificial silicon dioxide SiO2 layer 107 and exposed portions of the poly layer 106 and permeable polysilicon layer 103 and planarized, as shown in FIG. 8. Portions of the structural layer 108 form anchor points 117.

Figure 9A:
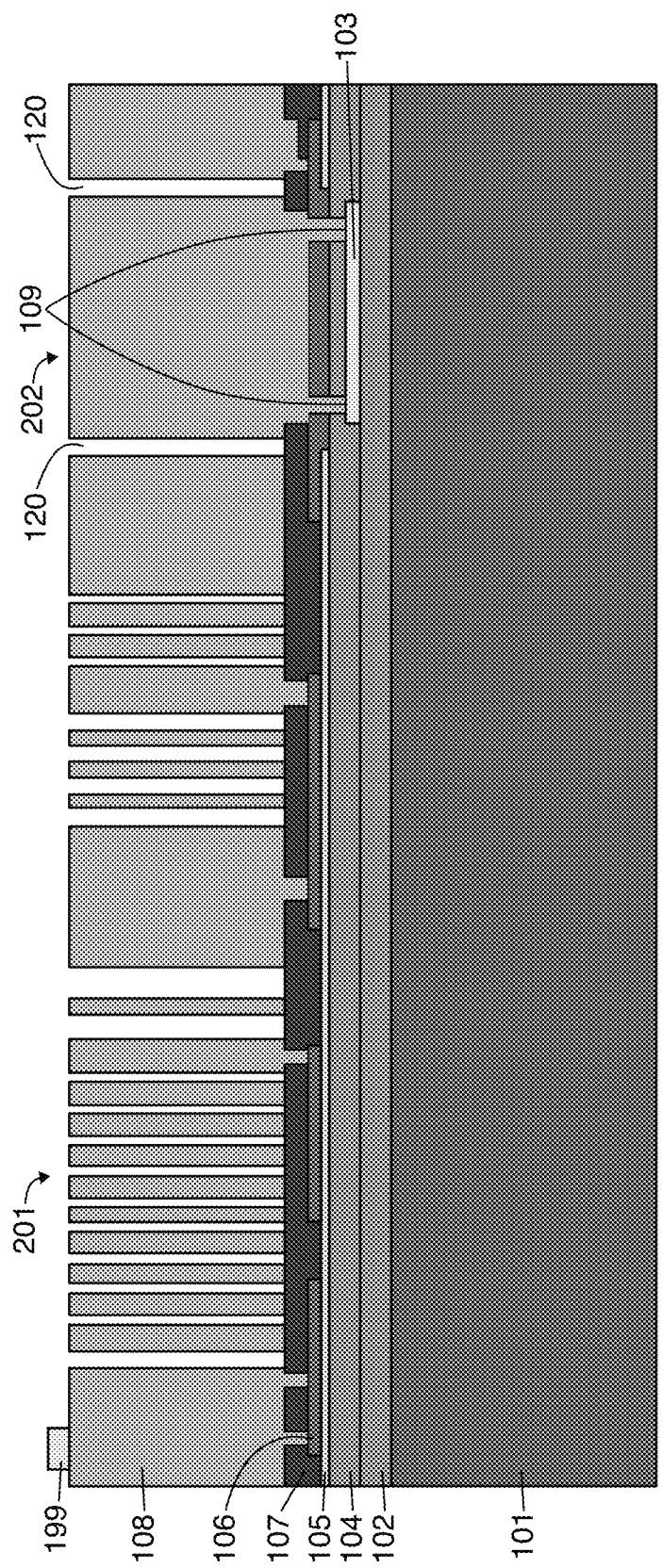
FIG. 9A is a cross sectional view of the MEMS IMU disclosed herein under formation at a ninth step after the functional layer is pattered and etched.
Figure 9B:
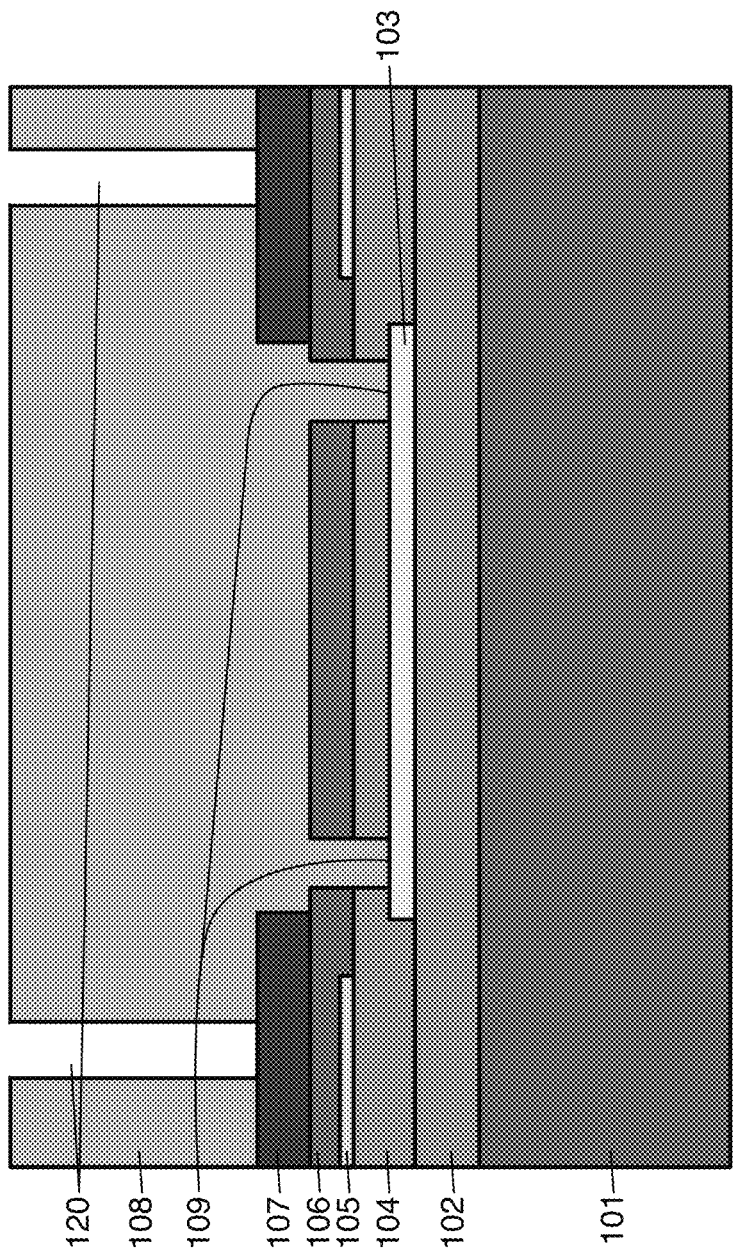
FIG. 9B is a version of FIG. 9A enlarged at the portion thereof around the permeable polysilicon layer.
Figure 10A:
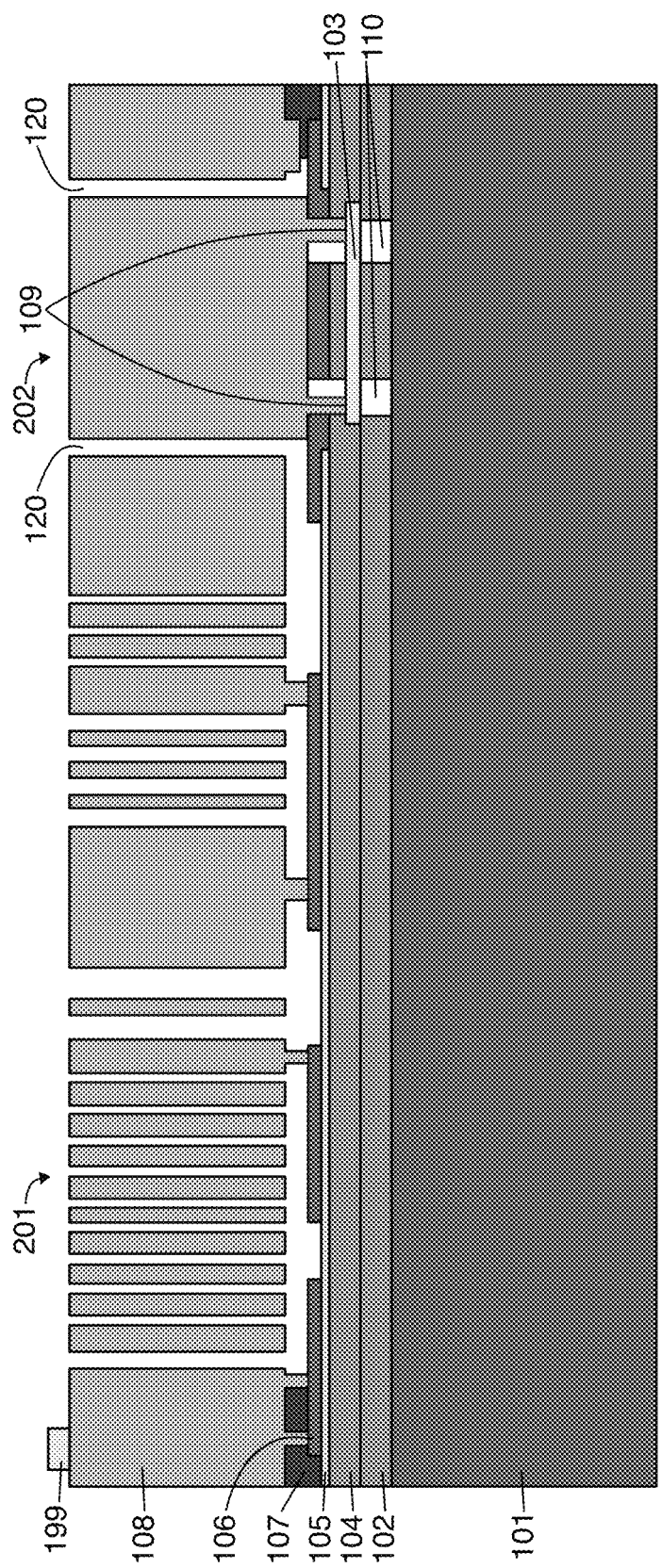
FIG. 10A is a cross sectional view of the MEMS IMU disclosed herein under formation at a tenth step after a first vHF release.
Figure 10B:
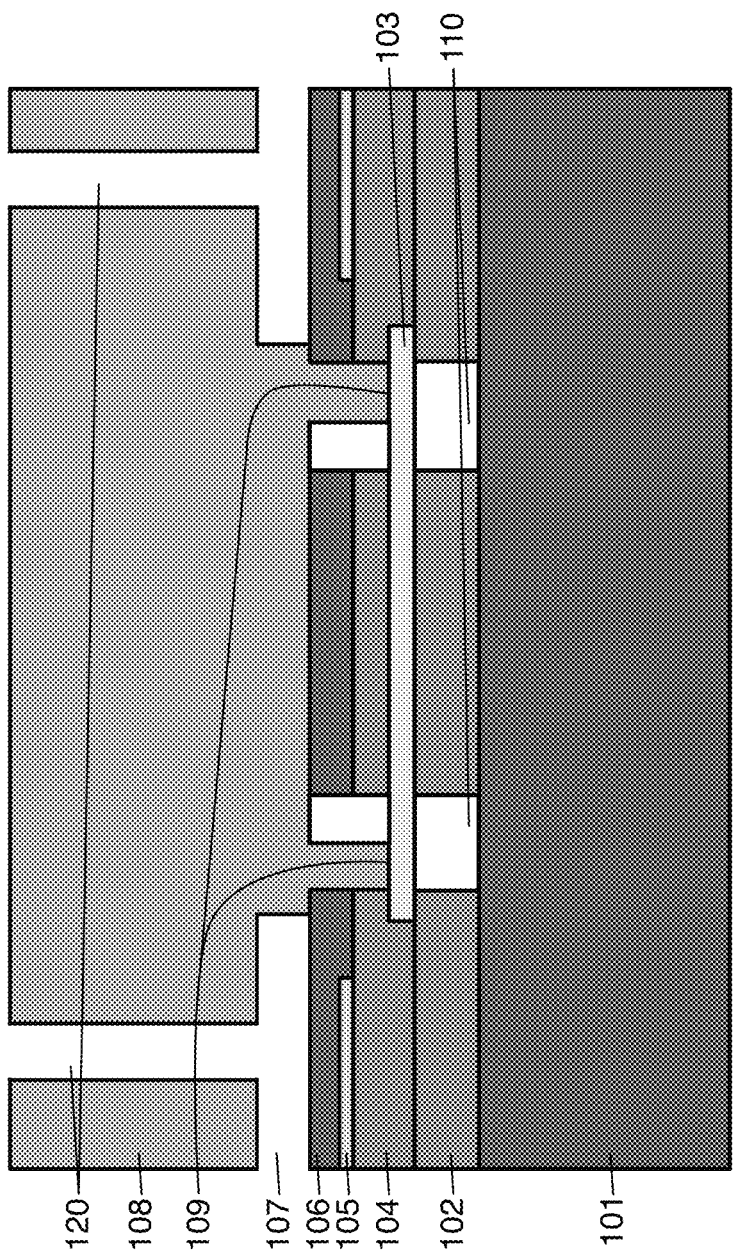
FIG. 10B is a version of FIG. 10A enlarged at the portion thereof around the permeable polysilicon layer.

An interconnection layer 199 is formed atop the structural layer 108, and the structural layer 108 is then patterned and etched to form the accelerometer 201 and gyroscope 202 structures, as shown in FIGS. 9A, 9B. As also shown, trenches 120 extending downward to the anchor points 117 are also formed by the patterning and etching. The resulting overlap between the trenches 120 and the permeable polysilicon layer 103, SiO2 layer 104, HF etch resistant layer 105, and sacrificial SiO2 layer 107 is set as desired by this operation, for example between 30 nm and 1 μm. vHF etching (e.g., a first vHF release) is then performed, removing portions of the sacrificial SiO2 layer 107 exposed by the patterning and etching of the structural layer 108, as shown in FIGS. 10A, 10B.

Note here that portions of the thermal oxidation layer 102 under the permeable polysilicon layer 103 are also removed by this vHF etching to define chambers 110—this occurs because although the structural layer 108 appears to extend fully through the openings 109 formed in the poly layer 106 and SiO2 layer 104 defined during the process steps shown in FIG. 9A, 9B, it will be seen that in top view (described below), portions of the openings 109 were instead filled by the sacrificial SiO2 layer 107. Therefore, the vHF vapor can pass through to reach the permeable polysilicon layer 103 to reach underlying portions of the oxidation layer 102, as well as side end portions of the SiO2 layer 104 and poly layer 106 stacked atop the permeable polysilicon layer 103.

Figure 11:
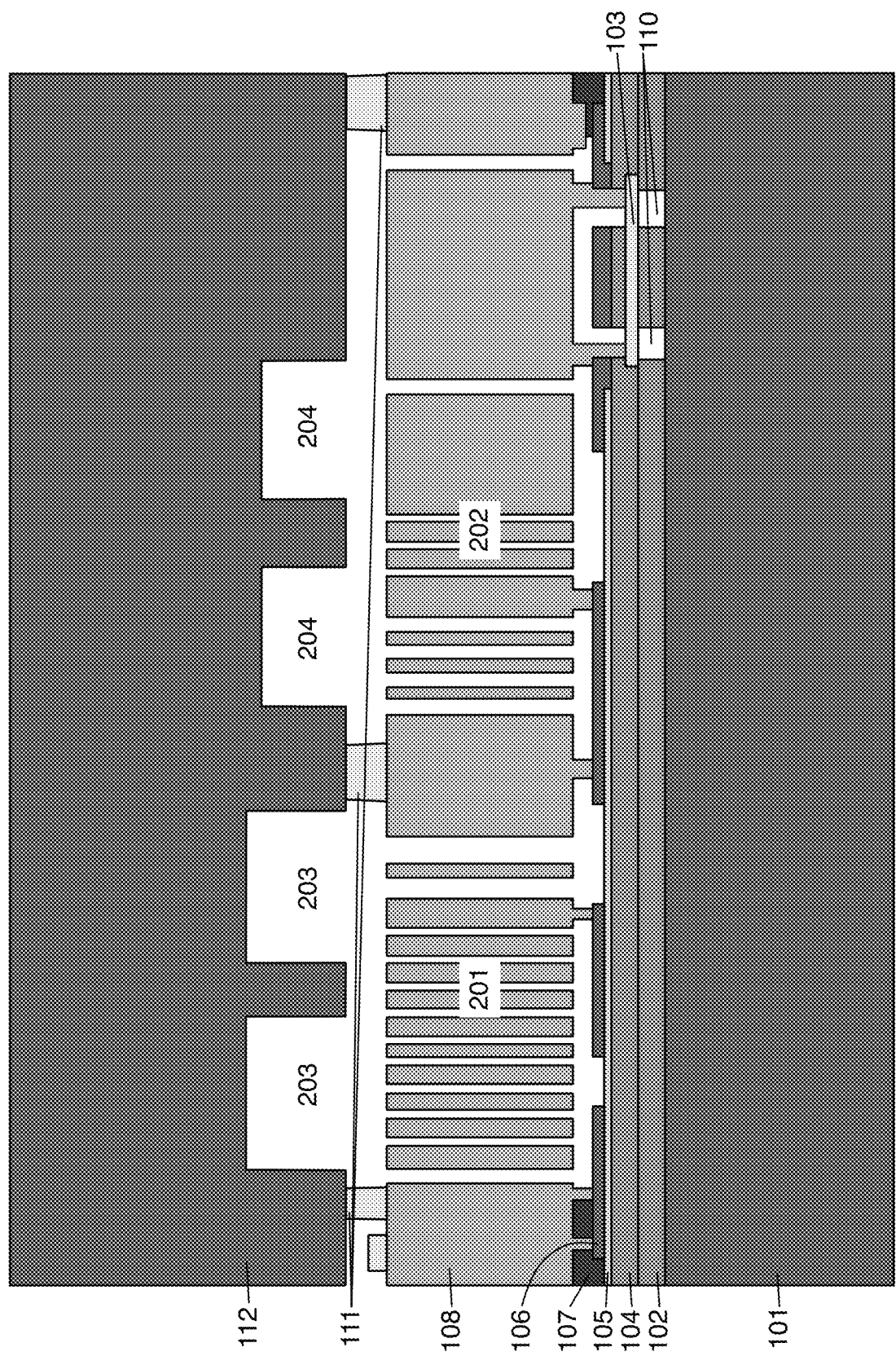
FIG. 11 is a cross sectional view of the MEMS IMU disclosed herein under formation at an eleventh step after bonding of a cap to the device under formation, which in turn sets the final working pressure of the accelerometer portion of the functional layer.

A cap wafer 112 is then glass frit bonded to the structural layer 108 at bonding points 111, as shown in FIG. 11. Alternatively eutectic AlGe or Au bonding can be used. The cap wafer 112 has cavities 203 and 204 defined therein to permit movement of the accelerometer 201 and gyroscope 202 during operation, and the bonding points 111 are set so as to seal those cavities individually to the structural layer 108. The bonding is performed in a controlled environment that matches the desired atmosphere and pressure for the accelerometer 201, which in turn sets the final working pressure of the accelerometer 201. Thus, after this step, the cavity 203 and cavity 204 are both at the desired atmosphere and pressure for the accelerometer 201. The back of the substrate 101 and/or cap wafer 112 is then ground to a desired thickness.

Figure 12A:
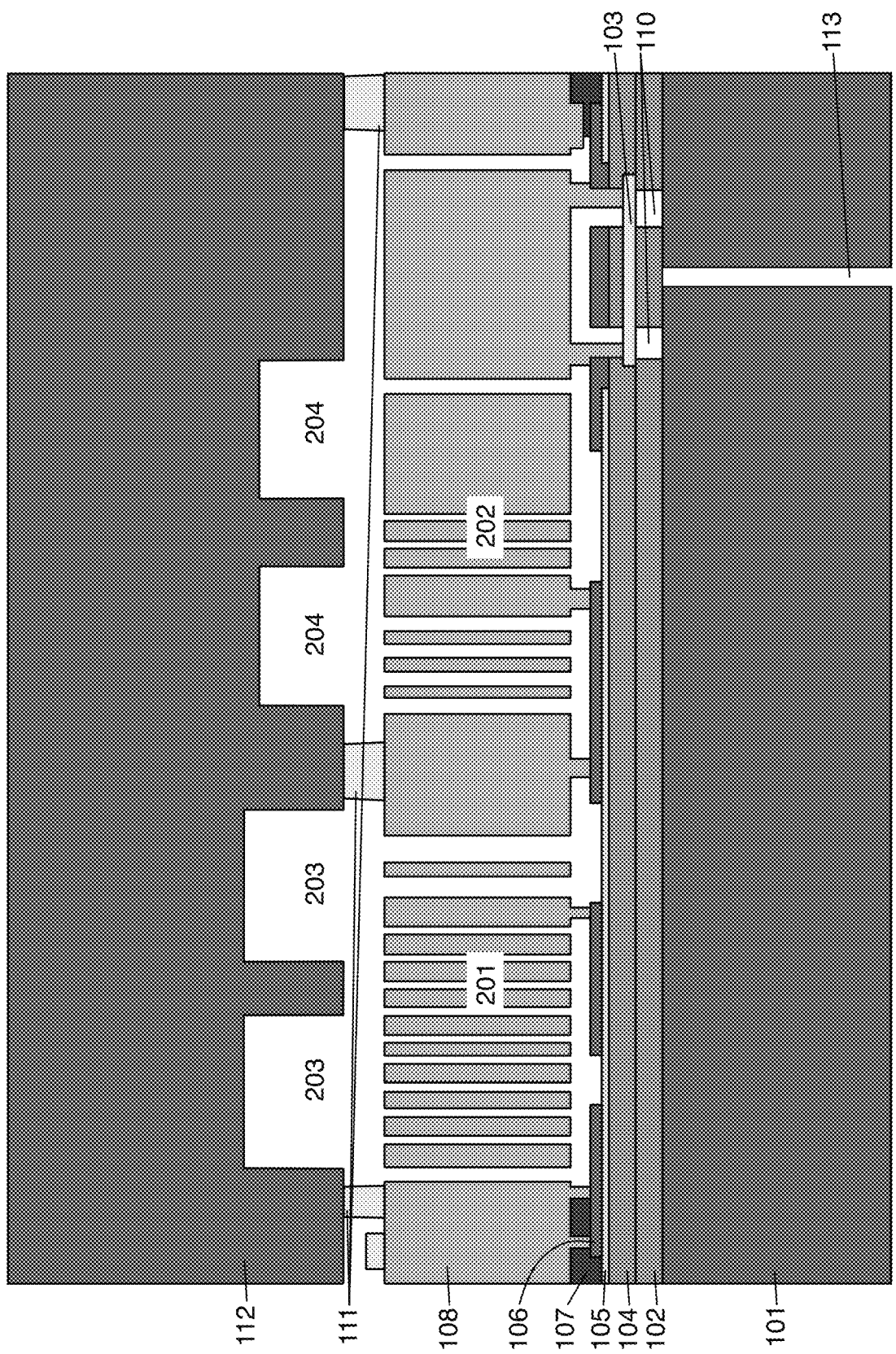
FIG. 12A is a cross sectional view of the MEMS IMU disclosed herein under formation at a twelfth step after formation of a chimney behind the permeable polysilicon layer.
Figure 12B:
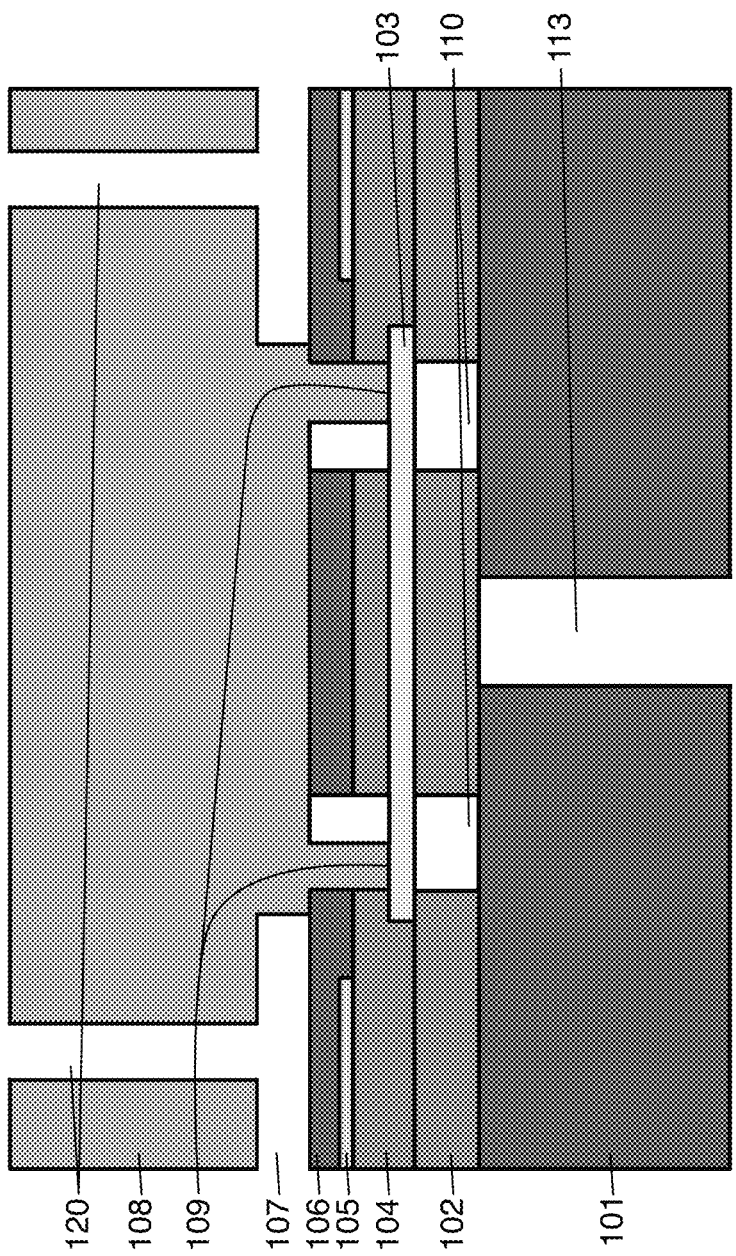
FIG. 12B is a version of FIG. 12A enlarged at the portion thereof around the permeable polysilicon layer.
Figure 13A:
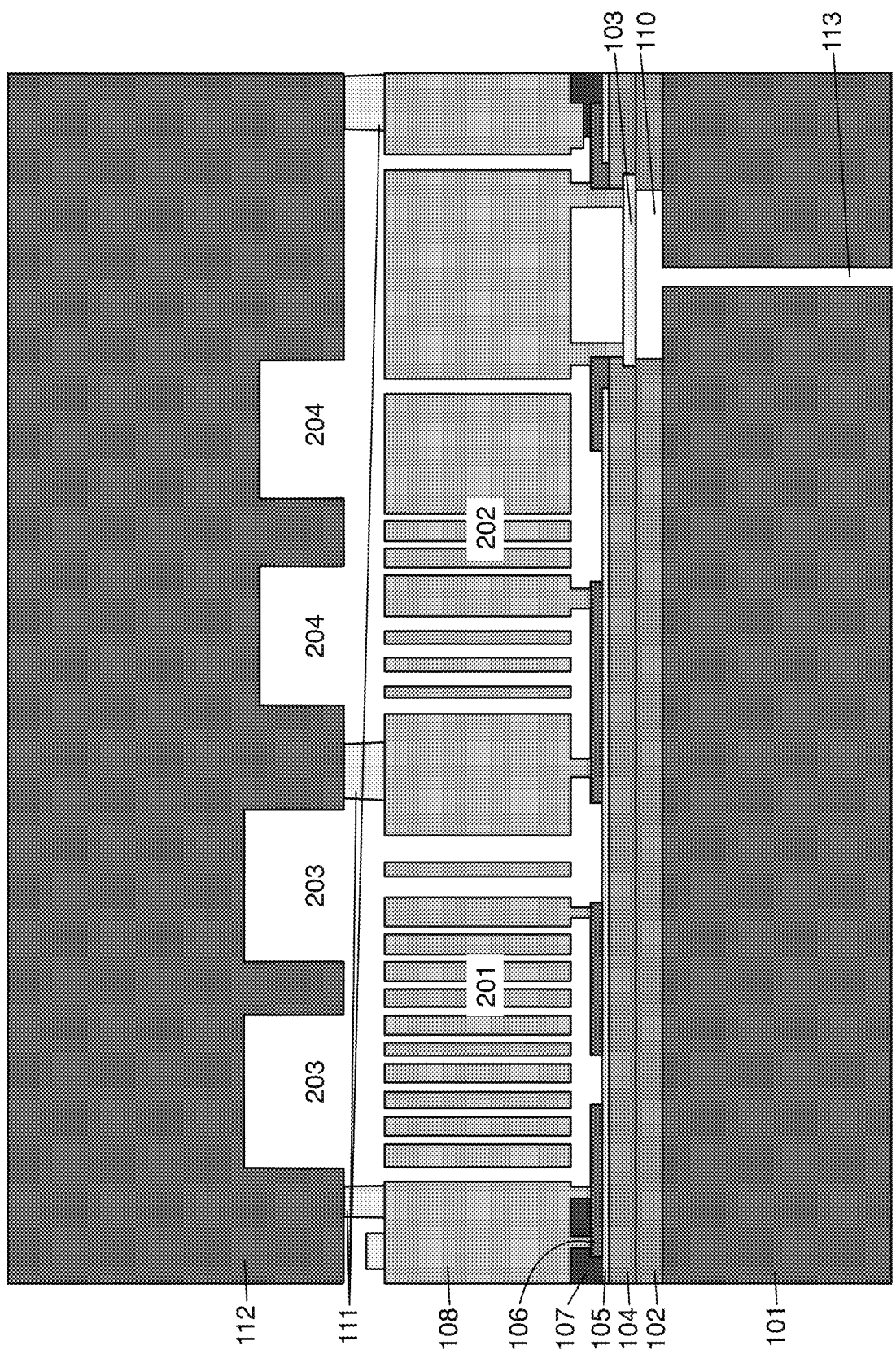
FIG. 13A is a cross sectional view of the MEMS IMU disclosed herein under formation at a thirteenth step after a second vHF release.
Figure 13B:
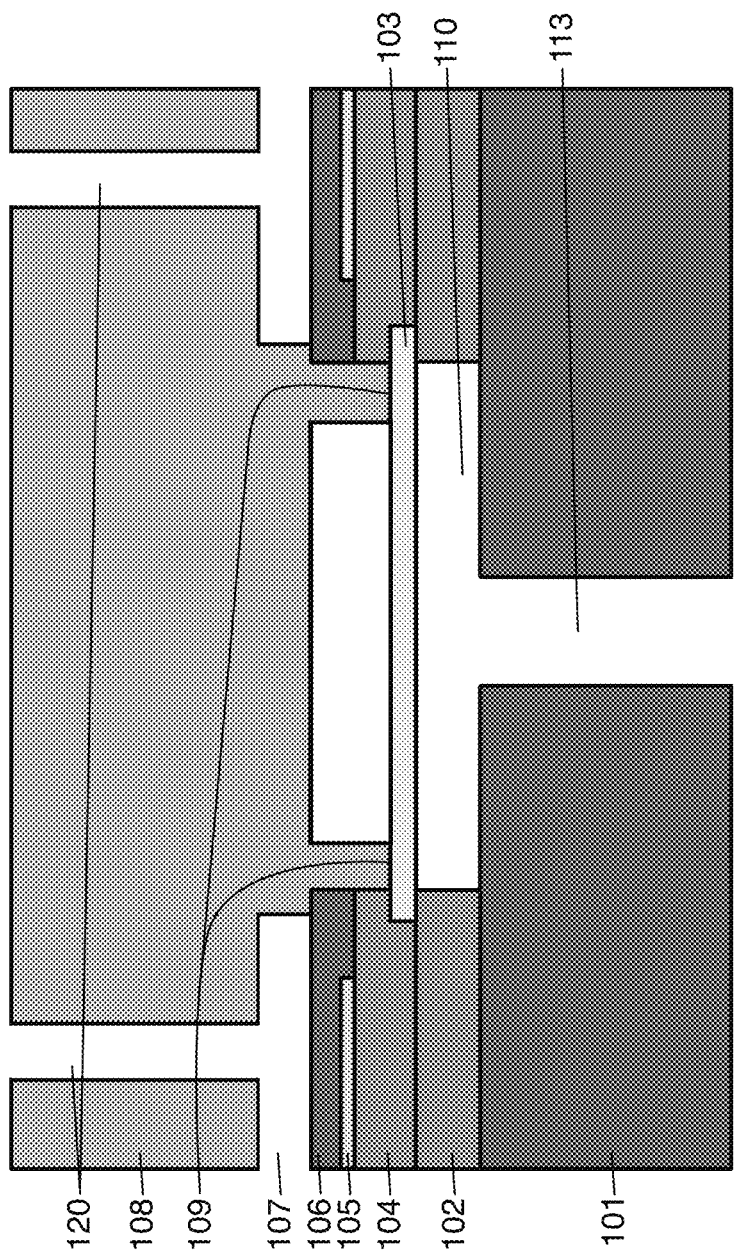
FIG. 13B is a version of FIG. 13A enlarged at the portion thereof around the permeable polysilicon layer.

A chimney opening 113 (e.g., 1 μm to 30 μm in diameter) is then etched into the back face of the substrate 101, extending all the way through the thickness of the substrate 101 until it reaches the back face of the permeable polysilicon layer 103, as shown in FIG. 12A, 12B. vHF etching (e.g., a second vHF release) is them performed, removing portions of the thermal oxidation layer 102 under the permeable polysilicon layer 103, and since the vHR vapor passes through the permeable polysilicon layer 103, also removing the SiO2 layer 104 and polysilicon layer 106 stacked atop the permeable polysilicon layer 103, as shown in FIG. 13A, 13B.

Figure 14A:
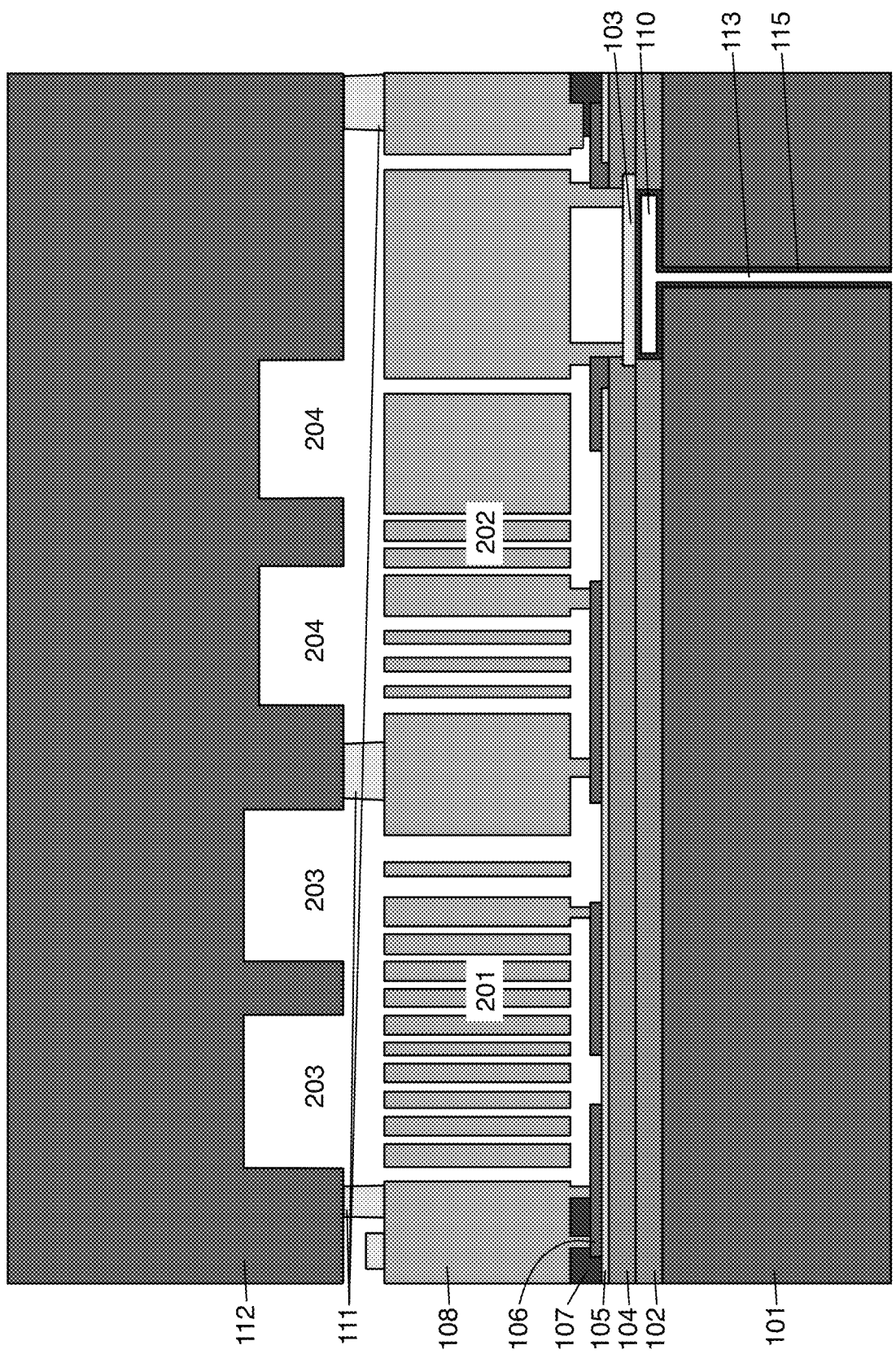
FIG. 14A is a cross sectional view of the MEMS IMU disclosed herein under formation at a fourteenth step after formation of a silicon, silicon oxide, silicon nitride, and/or silicon oxynitride plug in the chimney, with the final working pressure for the gyroscope portion of the structural layer being set by the pressure during this fourteenth step.
Figure 14B:
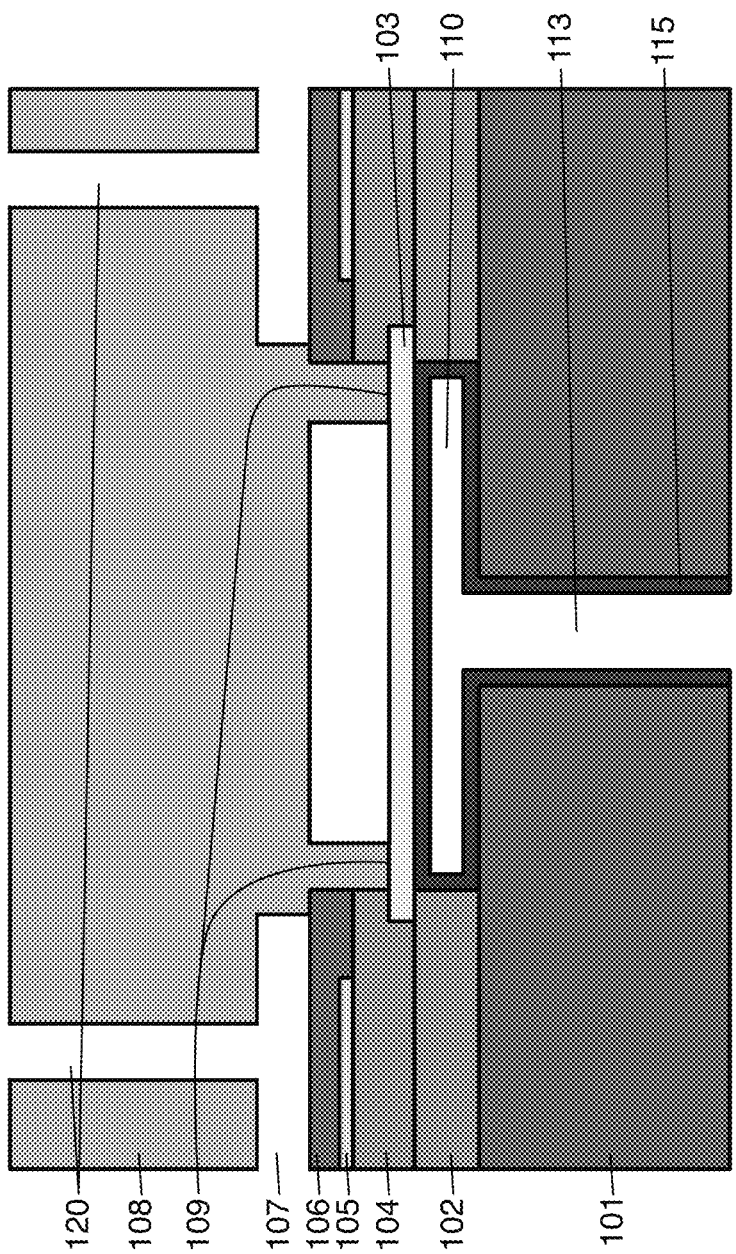
FIG. 14B is a version of FIG. 14A enlarged at the portion thereof around the permeable polysilicon layer.

This serves to release the atmosphere inside the cavity 204, allowing the atmosphere inside the cavity 204 to be set to the atmosphere of the environment at this point in the process. A plug 115 is then formed in the chimney 113 to seal the chimney, through a deposition of silicon, silicon dioxide $SiO_2$, and/or silicon nitride SiN or silicon oxynitride SiON deposition to completely seal the back face of the permeable polysilicon 103, as shown in FIG. 14A, 14B. The pressure during deposition of the layer 115 sets the final pressure within the cavity 204 and therefore the final working pressure of the gyroscope 202. At this point, the two sealed cavities 203 and 204 have been formed, each being at a desired atmosphere and pressure (e.g., cavity 203 being at 200 mBar and cavity 204 being at 1 mBar).

Figure 15:
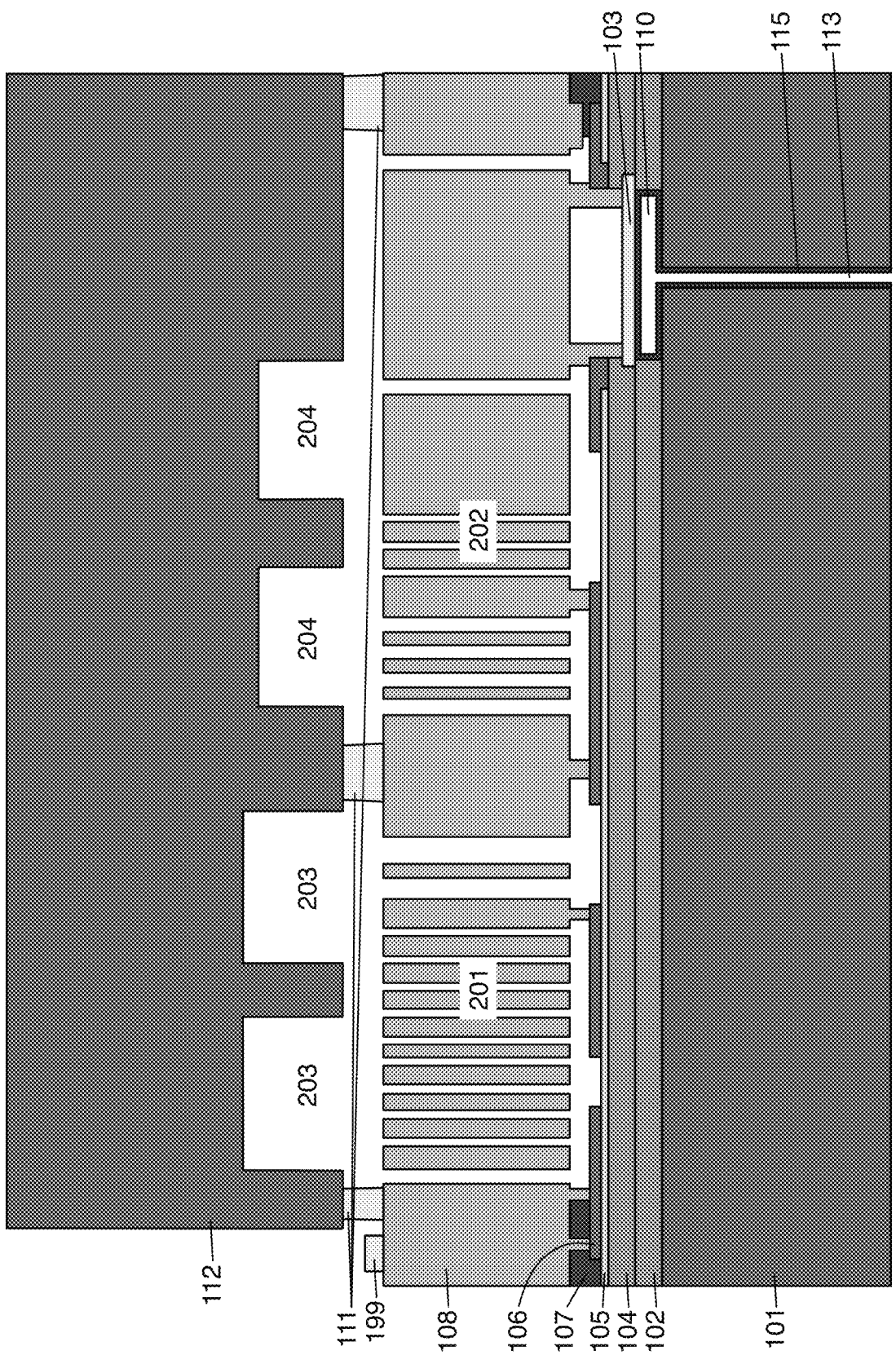
FIG. 15 is a cross sectional view of the MEMS IMU disclosed herein under formation at a fifteenth step after exposure of a part of the interconnection layer.

The cap wafer 112 is then cut or ground to expose the interconnection layer 199, as shown in FIG. 15.

Figure 16:
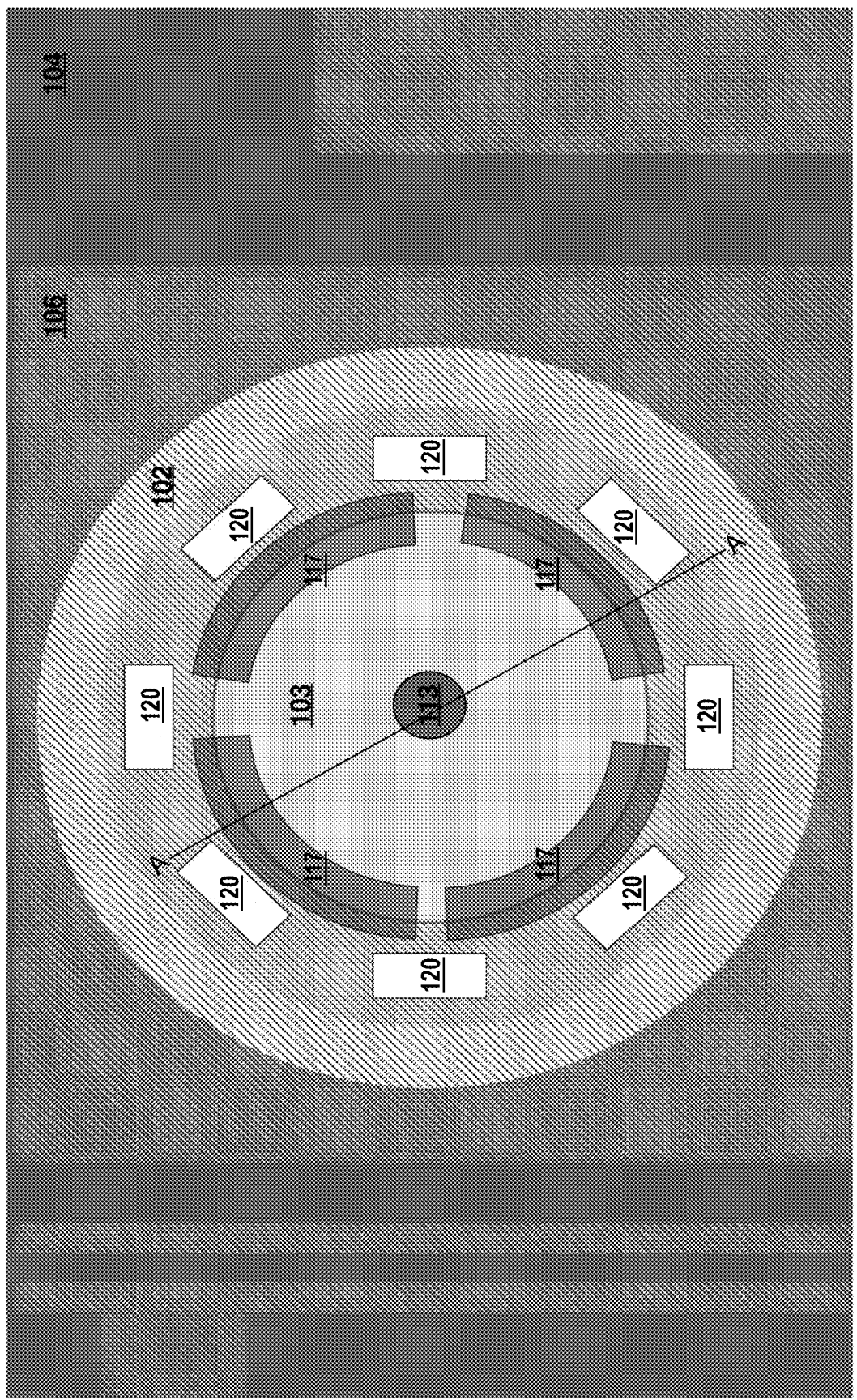
FIG. 16 is a top plan view of the MEMS IMU described herein.

Above it was noted that in the process flow step shown in FIGS. 10A, 10B, portions of the thermal oxidation layer 102 under the permeable poly silicon layer 103 are also removed by this vHF etching to define chambers 110. This can best be understood from the top plan view shown in FIG. 16, where it can be observed that the anchor points 117 do not form a solid ring around the permeable polysilicon layer 103, and are instead broken to allow passage of the vHF vapor therethrough. When reviewing the top plan view of FIG. 16, observe that the cross-sectional views of FIGS. 1-15 are taken through line A-A in FIG. 16.

The above process flow permits formation of a MEMS IMU to have two separate cavities set at different desired atmospheres and temperatures, through front-end fabrication steps, without the complexity and expense of placing a getter in one of the cavities.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of forming a package including a first instrument positioned within a first cavity maintained at a first pressure and a second instrument positioned within a second cavity maintained at a second pressure different than the first pressure, the method comprising:
    forming an oxide layer on a substrate;
    depositing a permeable layer on the oxide layer, the permeable layer being gas permeable but vapor etch resistant;
    depositing an insulator layer on the permeable layer and exposed portions of the oxide layer;
    depositing a barrier layer on the insulator layer;
    depositing a sacrificial layer over exposed portions of the insulator layer;
    etching the sacrificial layer and insulator layer at portions thereof overlying the permeable layer so as to expose portions of the permeable layer;
    forming a structural layer over the sacrificial layer and exposed portions of the permeable layer;
    forming the first and second instruments in the structural layer;
    performing a first vapor etching through open portions of the structural layer to remove exposed portions of the sacrificial layer, the first vapor etching also passing through the permeable layer at the exposed portions thereof to thereby remove portions of the oxide layer underlying the permeable layer to expose portions of the substrate;
    bonding a cap wafer to the structural layer at bonding points to thereby:
        form the first cavity as being sealed by the cap wafer, portions of the barrier layer underlying the structural layer adjacent the first instrument, and the bonding points; and
        form the second cavity as being sealed by the cap wafer, portions of the barrier layer, underlying the structural layer adjacent the second instrument, and the exposed portions of the substrate;
    wherein the bonding of the cap wafer to the structural layer is performed at a first pressure, thereby setting pressure within the first and second cavities to the first pressure;
    forming a chimney opening extending through an entire thickness of the substrate to reach the permeable layer;
    performing a second vapor etching through the chimney opening and permeable layer to remove portions of the oxide layer under the permeable layer and portions of the insulator layer stacked on the permeable layer, thereby creating a fluid connection extending from the chimney opening into the second cavity;
    setting the pressure inside the second cavity to a second pressure different than the first pressure; and
    forming a plug in the chimney opening to thereby seal the second cavity.

2. The method of claim 1, wherein the oxide layer is a thermal oxidation layer.

3. The method of claim 1, wherein the permeable layer is comprised of a permeable polysilicon material.

4. The method of claim 1, wherein the insulator layer is comprised of silicon dioxide SiO2.

5. The method of claim 1, wherein the barrier layer is comprised of aluminum oxide or silicon nitride.

6. The method of claim 1, wherein the sacrificial layer is comprised of silicon dioxide SiO2.

7. The method of claim 1, wherein the structural layer is formed from polysilicon.

8. The method of claim 1, wherein the first instrument is an accelerometer and the second instrument is a gyroscope; and wherein the second pressure is less than the first pressure.

9. The method of claim 1, wherein the bonding of the cap wafer to the structural layer is performed by glass frit bonding, eutectic AlGe, or Au bonding.

10. The method of claim 1, further comprising prior to depositing the sacrificial layer, forming a runner layer on the barrier layer to create an interconnection layer; wherein the sacrificial layer is also deposited over the runner layer; wherein the runner layer is also etched along with the sacrificial layer and insulator layer to expose the portions of the permeable layer; wherein the structural layer is also formed over exposed portions of the runner layer; wherein the first cavity is also sealed by portions of the runner layer; wherein the second cavity is also sealed by portions of the runner layer; and wherein the second vapor etching is also performed to remove portions of the runner layer stacked on the permeable layer.

11. The method of claim 10, further comprising exposing a portion of the interconnection layer.

12. A method of forming a package including a first instrument positioned within a first cavity maintained at a first pressure and a second instrument positioned within a second cavity maintained at a second pressure different than the first pressure, the method comprising:
    performing a first vapor etching to etch a sacrificial layer underneath a structural layer containing the first and second instruments to thereby delimit a bottom of the first and second cavities;

bonding a cap wafer over the first and second cavities to thereby delimit a top of the first second cavities, with a pressure during the bonding setting the first and second cavities to be at the first pressure;

forming a chimney underneath a permeable layer disposed on a bottom of the second cavity;

performing a second vapor etching through the chimney and the permeable layer to expose the second cavity; and forming a plug in the chimney to thereby re-seal the second cavity, with a pressure during the formation of the plug setting the second cavity to be at the second pressure, the second pressure being less than the first pressure.

13. The method of claim 12, wherein the permeable layer is comprised of a permeable polysilicon material.

14. The method of claim 12, wherein the first instrument is an accelerometer and the second instrument is a gyroscope; and wherein the second pressure is less than the first pressure.

15. The method of claim 12, wherein the bonding of the cap wafer is performed by bonding the cap wafer to a structural layer containing the first and second instruments.

16. The method of claim 15, wherein the bonding is performed by glass frit bonding, eutectic AlGe, or Au bonding.

17. The method of claim 15, wherein the structural layer is formed from polysilicon.

18. A package, comprising:
a substrate having a through-hole defined in its back face;
an oxide layer disposed on a front face of the substrate, with an opening defined in the oxide layer over the through-hole in the substrate;
a permeable layer disposed on the oxide layer and extending across the opening in the oxide layer;
an insulator layer disposed at least on the oxide layer, with an opening defined in the insulator layer at least partially over the permeable layer;
a structural layer positioned over the insulator layer and permeable layer, the structural layer having first and second instruments formed therein; and
a cap layer bonded to the structural layer;
wherein the insulator layer, structural layer, and cap layer are cooperative shaped so as to define a first sealed cavity containing the first instrument and a second sealed cavity containing the second instrument and the permeable layer; and
wherein a first air pressure within the first sealed cavity is different than a second air pressure within the second sealed cavity.

19. The package of claim 18, further comprising a sealing plug positioned within the through-hole in the substrate, the sealing plug being shaped so as to environmentally seal a back face of the permeable layer against environmental instrusion.

20. The package of claim 18, wherein the first instrument is an accelerometer and the second instrument is a gyroscope; and wherein the second air pressure is less than the first air pressure.

* * * * *